Figure 1:
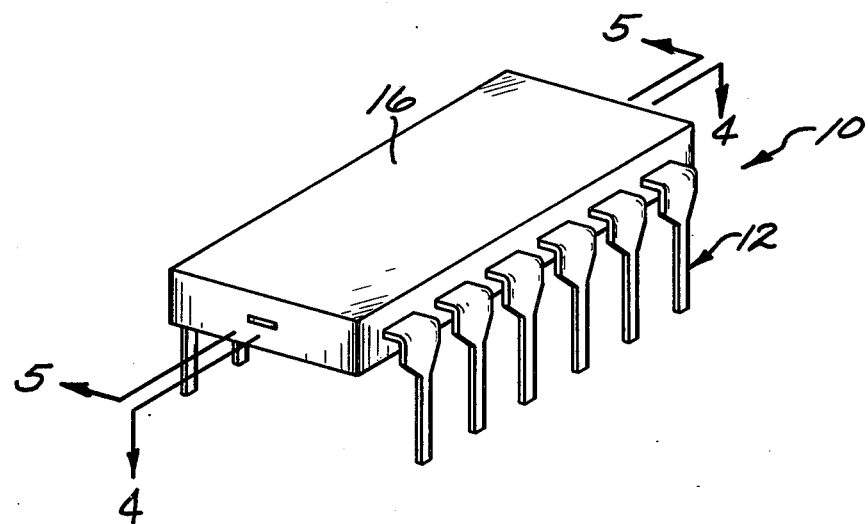

United States Patent [19]

Dromsky

[11] 4,141,029

[45] Feb. 20, 1979

[54] INTEGRATED CIRCUIT DEVICE

[75] Inventor: John A. Dromsky, North Attleboro, Mass.

[73] Assignee: Texas Instruments Incorporated, Dallas, Tex.

[21] Appl. No.: 866,108

[22] Filed: Dec. 30, 1977

[51] Int. Cl.² .................... H01L 23/48; H01L 29/44; H01L 29/52
[52] U.S. Cl. ........................ 357/70; 357/71; 357/72; 428/596; 174/52 FP
[58] Field of Search ............. 357/65, 67, 69, 70, 357/71, 72; 428/596; 174/52 FP

[56] References Cited

U.S. PATENT DOCUMENTS

| | | | |
|---|---|---|---|
| 3,422,320 | 1/1969 | Woodling | 357/67 |
| 3,436,810 | 4/1969 | Kauffman | 357/70 |
| 3,559,285 | 2/1971 | Kauffman | 357/70 |
| 3,566,207 | 2/1971 | Adams | 357/70 |
| 3,773,628 | 11/1973 | Misawa et al. | 357/70 |
| 3,839,660 | 10/1974 | Stryker | 357/67 |
| 4,065,625 | 12/1977 | Iwai et al. | 357/70 |

*Primary Examiner*—Andrew L. James
*Attorney, Agent, or Firm*—John A. Haug; James P. McAndrews

[57] ABSTRACT

An improved integrated circuit device includes a lead frame having a pad and having a plurality of lead members extending away from a location adjacent to the pad. The lead frame is blanked from a metal laminate which is formed by pressure bonding a layer of copper to each of two opposite sides of a layer of high chromium-low nickel stainless steel and which is annealed and then provided with a selected degree of work-hardening prior to blanking. The blanked lead frame surfaces are plated with an inner nickel plating and with an outer silverplating. An integrated circuit unit is mounted on the lead frame pad and terminals of the unit are connected to selected lead members. The pad, unit and portions of the lead members are encapsulated in a nonconductive organic material to permit ends of the lead members to extend from the encapsulation. The device displays an improved combination of technical properties in a low cost structure.

5 Claims, 6 Drawing Figures

INTEGRATED CIRCUIT DEVICE

In integrated circuit devices having an integrated circuit unit mounted on a lead frame and encapsulated in an organic material, it is desirable that the lead members extending from the encapsulating means have substantial strength and corrosion resistance so that the devices are easily handled and mounted without excessive bending of the lead members and so that the devices are adapted for use in severe environments. The lead members should also have good electrical conductivity, should be solderable, and should have low contact surface resistance to assure easy and reliable connection of the devices in an electrical circuit. The lead members should also have good thermal conductivity for rapidly dissipating heat from within the devices to avoid device deterioration resulting from excessive heating. The integrated circuit units in the devices should be easily and reliably secured on the lead frame and terminals of the unit should be easily and reliably connected to selected lead members of the frame by the use of fine lead wires or the like. The encapsulating material should be securely adhered to the lead members for excluding moisture from within the devices and the encapsulating material should be stable and should not be chemically contaminated during use to assure that moisture sealing of the device is retained through a long service life. It is also desirable hat these technical properties be provided in a device which is characterized by low cost. In this latter regard it will be appreciated that, when a particular integrated circuit chip or unit is manufactured in large volume, the cost of the unit becomes quite small. Accordingly, the cost of the lead frame in the device and the cost of device assembly come to represent very substantial proportions of the cost of the finished devices. Further, because of the very large volumes in which such integrated circuit devices are manufactured, even small savings which can be achieved in the material and manufacturing costs for each device can be of substantial value when considered in view of the total manufacturing volume.

In conventional integrated circuit devices, however, one or more of the desirable technical properties noted above may be lacking or may be achieved in combination with the other desired properties only at excessive cost. For example, in one known device where the lead frame is formed of a high nickel alloy having a silver plating, the lead members are sturdy, corrosion resistant and solderable and display low contact surface resistance. However, the nickel alloy is expensive and adequate heat dissipation capability is provided in the device only by using an excessive thickness of the silver plating. Thus that known device achieves the noted combination of technical properties only with excessive material cost. In another known device where the lead frame is formed of copper having a nickel inner plating and an outer silver plating, the lead members have much greater thermal conductivity for adequately dissipating heat from within the device. Accordingly a lesser thickness of silver plating can be used. The nickel plating serves as a barrier to diffusion of the copper material into the organic encapsulating material for preventing deterioration of the encapsulating material such as might be due to contamination by the highly reactive copper. However, the copper material is again expensive, particularly where cupronickel or other high strength copper materials are used to provide the lead members of the device with adequate strength. In addition, the copper materials used in such known lead frames tend to be somewhat difficult to blank to provide the lead frames with the narrow, precisely defined lead members which are required. Thus manufacturing costs are high and manufacturing yields tend to be less than desired.

It is an object of this invention to provide a novel and improved integrated circuit device; to provide such a device having a desired combination of technical properties in a lower cost structure; to provide such a device having strong and corrosion resistant lead members which are easily soldered and which display low contact surface resistance; to provide such a device in which an integrated circuit unit is easily and reliably mounted on a lead frame and in which terminals of the unit are easily and reliably connected to selected lead members; to provide such a device which is adapted to rapidly dissipate heat from within the device; to provide such a device having encapsulating means which exclude moisture from within the device and which retain such moisture sealing properties throughout a long service life; and to provide a novel and improved method for manufacturing such a device.

Briefly described, the novel and improved integrated circuit device of this invention comprises a lead frame having a mounting pad and having a plurality of separate lead members extending away from a location adjacent to the pad. In accordance with this invention, the lead frame is made from a metal laminate which is formed by pressure bonding a layer of copper to each of two opposite sides of a layer of stainless steel of the substantially nickel-free type having a chromium content of about 10.5 percent or more. This type of stainless steel is relatively inexpensive but provides the laminate material with the high strength and corrosion resistance suitable for most lead frame applications. The pressure bonded copper layers of the laminate are easily provided with the necessary thickness for providing the lead members with desired heat-dissipating properties at much lower cost than could be achieved by electroplating or the like. Pressure bonding of the laminate also provides a secure metallurgical bond of the copper layers to the stainless steel layer of the laminate even though the presence of chromium oxide on the surfaces of the inexpensive stainless steel material could be expected to interfere with adherence of a copper layer applied by other means such as electroplating. Thus the lead frame laminate is economically provided with excellent electrical and thermal conductivity properties in a high strength, corrosion resistant material. In addition, after pressure bonding the laminate is annealed and is subjected to additional rolling reduction in thickness to provide the laminate with a desired degree of work-hardening, thereby to optimize the material for the blanking of lead frames from the material so that lead frames are easily made from the laminate with high manufacturing yields. The lead frame is then blanked from the laminate in any conventional manner to form the desired pad and lead members in closely spaced relation to each other.

After blanking, the lead frame is plated in any conventional manner to form a thin inner plating of nickel and a thin outer plating of silver covering substantially all surfaces of the pad and of each of the lead members. An integrated circuit chip or unit of any conventional type is then bonded to the silver plated surface of the mounting pad and terminals of the unit are connected to silver plated surfaces of the selected lead members by the use of fine lead wires or the like in any conventional manner. The pad, unit and portions of each of the lead members are then enclosed in an organic, non-conductive encapsulating material in any conventional manner so that the encapsulating material adheres to the lead members for excluding moisture from within the device. In this arrangement, the silver plating facilitates reliable and convenient mounting of the integrated circuit unit on the mounting pad as well as reliable electrical connection of the unit terminals to the lead members. The silver plating also provides the distal ends of the lead members with excellent solderability and low contact surface resistance so that the lead members are easily and reliably connected in an electrical circuit. However, because the silver plating need not be relied upon to contribute any significant part of the thermal and electrical conductivity properties of the lead members, the silver plating is quite thin and is provided at relatively low cost. The nickel plating serves as a barrier to diffusion of copper from the lead frame to the surface of the encapsulating material during any thermal cycling of the integrated circuit device. The nickel plating therefore prevents contamination of the organic encapsulating material with highly reactive copper such as might be expected to cause deterioration of the encapsulating material and loss of its adherence to the lead members. Accordingly the device retains its moisture seal properties throughout a long service life.

In this way, the integrated circuit device of this invention achieves a very desirable combination of technical properties in a structure which is characterized by relatively low material and manufacturing cost and which is adapted for very large volume manufacture so that such cost savings are of substantial value.

Figure 2:
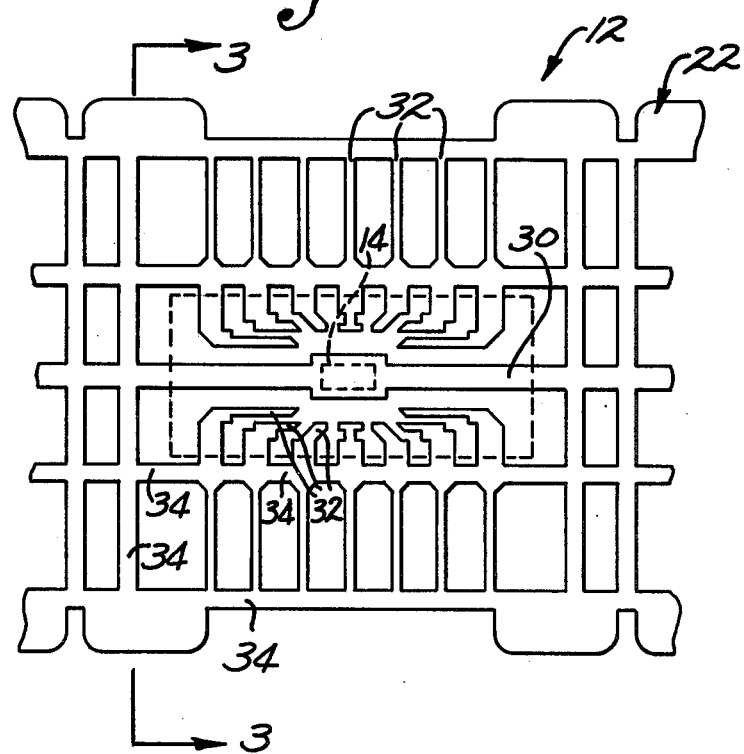
Figure 3:
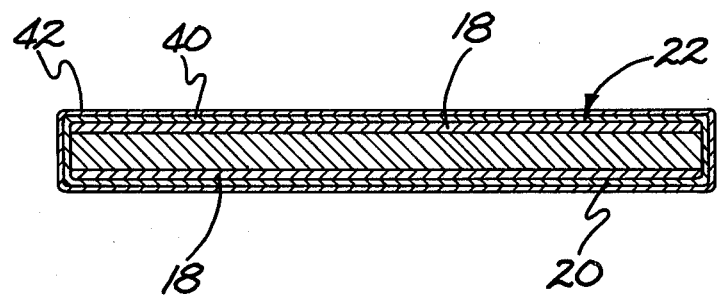
Figure 4:
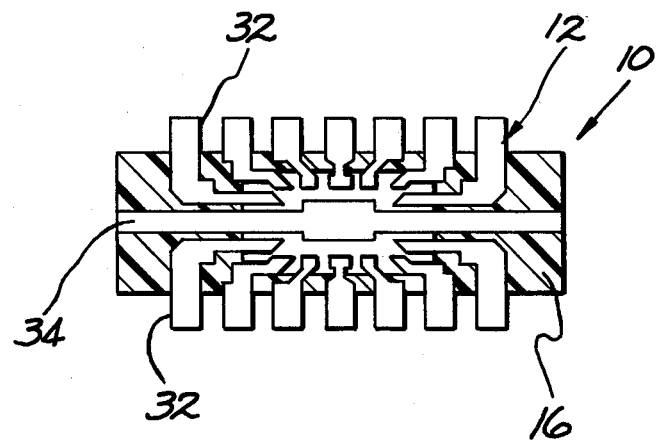
Figure 5:
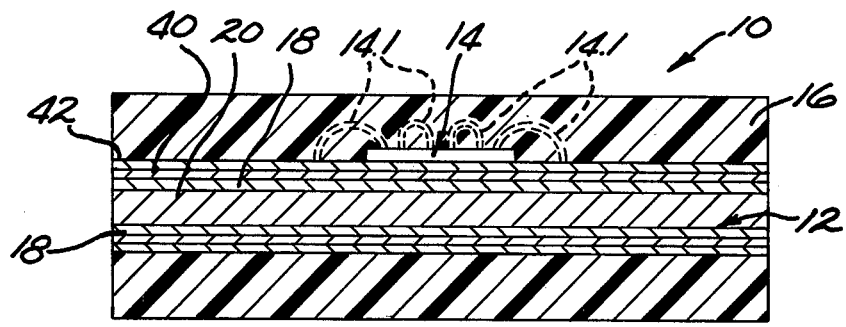
Figure 6:
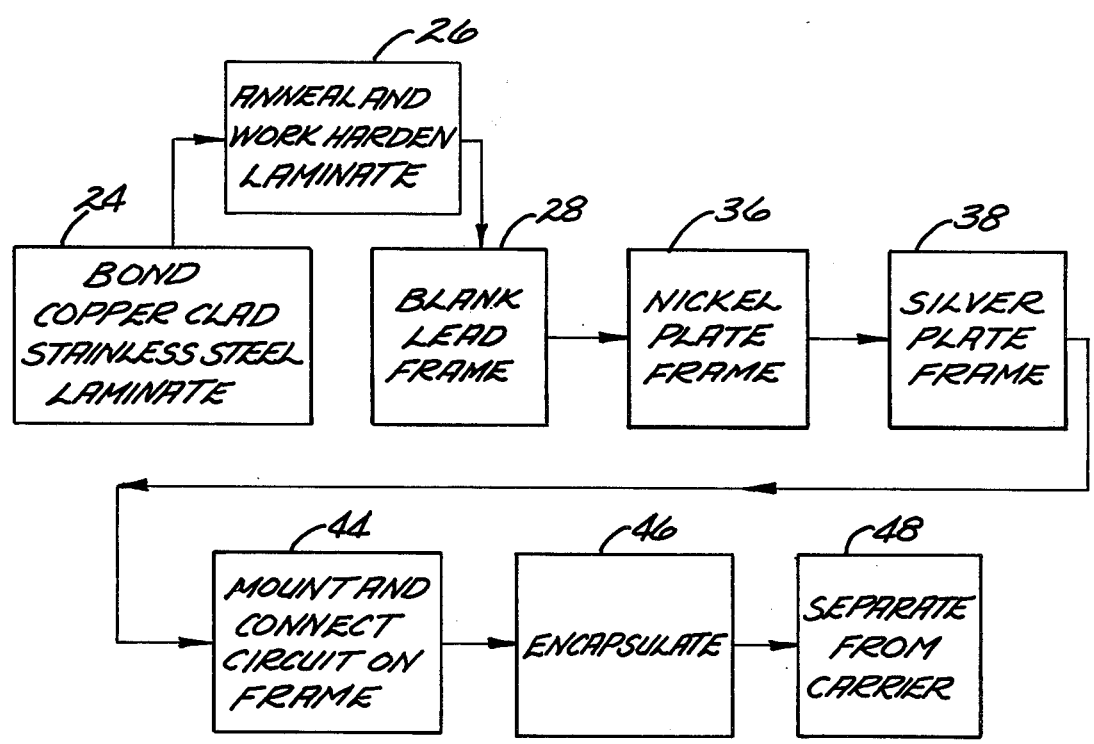

Other objects, advantages and details of the novel and improved integrated circuit device and method of manufacturing provided by this invention appear in the following detailed description of preferred embodiments of the invention, the detailed description referring to the drawings in which:

FIG. 1 is a perspective view of the integrated circuit device of this invention;
FIG. 2 is a plan view to enlarged scale illustrating a step in the manufacture of a component of the device of FIG. 1;
FIG. 3 is a section view along line 3—3 of FIG. 2;
FIG. 4 is a section view along line 4—4 of FIG. 1;
FIG. 5 is a section view along line 5—5 of FIG. 1; and
FIG. 6 is a block diagram schematically illustrating the method of this invention.

Referring to the drawings, 10 in FIGS. 1, 4 and 5 indicates the novel and improved integrated circuit device of this invention which is shown to include a lead frame means 12 mounting an integrated circuit unit 14 sealed within encapsulating means 16.

In manufacturing the device 10 according to the method of this invention, a layer of copper material is roll or pressure bonded in any conventional manner to each of two opposite sides of a core layer 20 of a selected stainless steel material to form a composite metal laminate 22 as is illustrated particularly in FIGS. 2 and 3. That is, as is schematically illustrated at 24 in FIG. 6, the copper layers 18 are squeezed against respective opposite sides of the core layer 20 with reduction in the thickness of the layer materials in the manner shown in U.S. Pat. No. 2,691,815 or in other conventional manner so that a metallurgical bond is formed between the contacting layers along the interfaces between the layers to secure the layers firmly together to form the laminate 22. Preferably the core layer 20 embodies a substantially nickel-free stainless steel having a chromium content of about 10.5 percent or more, by weight, so that the core layer displays substantial strength and corrosion resistance in a relatively low cost material. Preferably for example the core layer is formed of a material selected from the group including AISI (American Iron and Steel Institute designation) Type 409 or Type 430 Stainless Steel or Type E2 Stainless Steel available from the Crucible Steel Company, which materials have the following percentage compositions by weight:

Table I

| Type | 1 Carbon (Max.) | 2 Manganese (Max.) | 3 Phosphorous | 4 Sulfur (Max.) | 5 Silicon (Max.) | 6 Chromium | 7 Nickel | 8 Titanium | 9 Iron |
|---|---|---|---|---|---|---|---|---|---|
| 409 | 0.08 | 1.00 | 0.045 | 0.045 | 1.00 | 10.50 – 11.75 | — | 6 × carbon (min.) to 0.75 (max.) | Bal. |
| 430 | 0.12 | 1.00 | .040 | 0.030 | 1.00 | 16.00 to 18.00 | — | — | Bal. |
| E2 | .08 | 1.00 | 0.045 | 0.045 | 1.00 | 10.50 – 11.75 | .50 (max.) | 5 × carbon (min.) to .75 (max.) | Bal. |

Preferably the copper materials of the layers 18 are selected to display high electrical and thermal conductivity at low cost and to be easily bonded to the core layer 20, such materials preferably including CDA (Copper Development Association) CDA No. 102 or No. 103 of relatively low phosphorous content having the following percentage compositions by weight:

Table II

| Copper Alloy No. | Phosphorous | Copper |
|---|---|---|
| 102 | — | 99.95 (incl. silver with no residual deoxidants) |
| 103 | 0.001 – 0.005 | 99.95 (plus silver and phosphorous) |

The core layer of the laminate material 22 preferably comprises about 80 to 90 percent of the total thickness of the laminate while each of the copper layers 18 comprises about 5 to 10 percent of the laminate thickness for providing the laminate with electrical and thermal conductivity properties useful for lead frame applications while also displaying substantial strength. Typically, the laminate 22 has a finished thickness of about 0.010 inches with the copper layers 18 each having a thickness of about 0.0005 to 0.0010 inches.

In accordance with the method of this invention, the composite material 22 as initially bonded is annealed in any conventional manner where required as indicated at 26 in FIG. 6 for removing the work-hardening and for relieving the stresses which were introduced into the composite material during bonding of the laminate. The laminate is then subjected to further rolling reduction in thickness in conventional manner to provide the laminate with its desired final thickness and to reintroduce a selected degree of work-hardening to optimize the strength and blanking characteristics of the laminate. Typically for example, where the layer 20 embodies Type 430 Stainless Steel and the layers 18 embody CDA 102 Copper, with each copper layer comprising 5 percent of the total laminate thickness, the laminate is rolled to a final thickness of 0.010 inches to introduce 20 to 25 percent work-hardening for providing the laminate with a yield strength of about 80,000 psi and for optimizing the blanking characteristics of the laminate so that very narrow and very precisely defined lead members are adapted to be blanked from the laminate in closely spaced relation to each other with high manufacturing yield.

In accordance with the method of this invention, the laminate 22 as described above is blanked or stamped in any conventional manner as indicated at 28 in FIG. 6 to provide a lead frame structure as illustrated in FIG. 2. That is, a plurality of lead frame means 12 are preferably blanked in sequence from a strip of the laminate 22 to form a mounting pad 30 and to form a plurality of lead members 32, each of which has one end disposed adjacent to the pad 30 and which extends away from the pad. As initially blanked from the strip 22, the pad 30 and lead members 32 of the lead frames are preferably held in the desired spaced relation to each other and are supported by carrier portions 34 of the strip to facilitate subsequent handling of the lead frames 12.

In accordance with the method of this invention the blanked lead frame means 12 as shown in FIG. 2 are then electroplated in any conventional manner as indicated at 36 and 38 in FIG. 6, first to cover the surfaces of the blanked laminate with an inner nickel plate 40 and then to cover the same surfaces with an outer silver plate 42. As any conventional nickel plating process compatible with the copper and stainless steel materials of the laminate 22 is used within the scope of this invention, the nickel plating process is not further described herein and it will be understood that the nickel plate 40 readily adheres to the copper surfaces of the lead frame means 12 and also adheres adequately to the thin edges of the core layer of the laminate along the sides of the mounting pad 30 and the lead members 32. The nickel plating is provided with sufficient thickness to assure pore-free coverage of the copper surfaces of the blanked lead frames 12 but is otherwise kept relatively thin for reasons of economy, the nickel plate 40 preferably having a thickness in the range from 50 to 150 millionths of an inch for accomplishing these purposes. As any conventional silver plating process compatible with the nickel inner plating 40 is used within the scope of this invention, the silver plating process is not further described herein and it will be understood that the silver plating 42 need only have a thickness in the range from about 50 to 150 millionths of an inch for the purposes of this invention and is preferably maintained in that range for reasons of economy.

In accordance with the method of this invention, the integrated circuit unit 14 comprises any conventional integrated circuit chip or unit which is secured to the mounting pad 30 of the lead frame 12 by soldering or the like or in any other conventional manner as is schematically indicated at 44 in FIG. 6. If desired, various conventional bonding pads or the like (not shown) are used between the integrated circuit unit 14 and the pad 30. Terminals of the unit 14 as indicated at 14.1 in FIG. 5 are then connected to selected lead members 32 of the lead frames by the use of fine lead wires 14.2 or the like in any conventional manner. The pad 30, the unit 14, and a first portion of each of the lead members 34 are then enclosed in a conventional non-conducting organic encapsulating material 16 as indicated in FIGS. 1, 4, and 5, and as indicated by the broken lines 16a in FIG. 2, so that the encapsulating material adheres to each of the lead members for excluding moisture from the integrated circuit unit 14 and for permitting the distal ends of the lead members 32 to extend from the encapsulating means. The encapsulating material 16 is of any conventional type such as a thermsetting epoxy or the like and is applied over the integrated circuit unit 14 and the lead frame 12 as indicated at 46 in FIG. 6 by conventional transfer or cast molding techniques or the like. The supporting portions 34 of the lead frames 12 as shown in FIG. 2 are then removed from the lead frame 12 in any conventional manner as indicated at 48 in FIG. 6 so that, as shown in FIG. 4, the lead members 32 are secured in separate, spaced relation to the pad 30 and to each other by the encapsulating material. As the procedures described above for mounting, connecting and encapsulating the integrated circuit unit 14 are described in U.S. Pat. No. 3,629,668 for example, they are not further described herein and it will be understood that those procedural steps in assembling the device 10 are fully conventional.

In the resulting structure of the integrated circuit device 10 as described above, the silver plate 42 on the mounting pad 30 facilitates secure and reliable mounting of the integrated circuit unit 14 on the pad using conventional mounting procedures. The silver plate 42 on the lead members similarly facilitates the connection of the unit terminals 14.1 to the lead members and also provides the distal ends of the lead members 32 with excellent solderability and with low contact surface resistance to facilitate reliable connection of the device 10 in an electrical circuit. However, because the silver plating need not be relied upon to provide any significant part of the electrical and thermal conductivity properties of the lead members 32, the silver plating is desirably left quite thin as noted above for significantly reducing the cost of the device 10 while retaining the above-noted technical properties of the device 10. The electrical and thermal conductivity properties of the lead members are primarily controlled by the easily and economically regulated thickness of the copper layers 18 of the laminate 22 so that the silver plate 42 need only be of sufficient thickness to provide the pad and lead members with the desired surface characteristics achieved by the silver material. The nickel plating 40 covers all copper surfaces of the pad 30 and of the lead members 32 which are enclosed in the encapsulating material 16 and serves as a barrier to diffusion of the highly reactive copper material into the encapsulating material 16 or into the silver plate 42. As a result, any tendency for the organic encapsulating material to be contaminated by the copper so that it might lose its adherence to the lead members 32 to permit moisture to enter the device is effectively eliminated. In this regard, the nickel plating is applied after annealing and blanking of the lead frame 12 so that the nickel plating is subjected to only limited heating during subsequent processing and use of the device 10. Accordingly, a very thin layer of nickel plate as noted above is adequate to prevent copper diffusion into the encapsulating material. In this way the device 10 achieves a desirable combination of technical properties with reduced material costs in a structure which is adapted to be economically made with high manufacturing yields.

It should be understood that although particular embodiments of this invention have been described by way of illustrating the invention, this invention includes all modifications and equivalents of the disclosed embodiments falling within the scope of the appended claims.

I claim:

1. In an integrated circuit device having lead frame means with a mounting pad and with a plurality of separate lead members extending from a location adjacent to the pad, an integrated circuit unit mounted on the pad having its terminals connected to selected lead members, and encapsulating means enclosing the unit and pad and first portions of each of the lead members permitting end portions of the lead members to extend from the encapsulating means, improved lead frame means wherein said pad and lead members each have a corrosion resistant core layer of stainless steel and a thermally conducting layer of copper material metallurgically bonded to two opposite sides of the core layer, said pad and at least said first portions of said lead members having an inner nickel plating and an outer silver plating on all surfaces thereof enclosed in said encapsulating means.

2. An integrated circuit device as set forth in claim 1 wherein said nickel and silver platings are disposed on substantially all surfaces of said lead members.

3. An integrated circuit device as set forth in claim 2 wherein said encapsulating means comprises an organic material.

4. An integrated circuit device as set forth in claim 3 wherein said thermally conducting layer of copper material metallurgically bonded to opposite sides of said core layer in each of the pad and lead members comprises at least five percent of the total thickness of the pad and lead members.

5. An integrated circuit device as set forth in claim 4 wherein said core layer material is selected from the group of stainess steels having a chromium content comprising at least 10.5 percent by weight of the stainless steel material.

* * * * *